United States Patent
Williams

(10) Patent No.: US 7,076,402 B2
(45) Date of Patent: Jul. 11, 2006

(54) CRITICAL APERTURE CONVERGENCE FILTERING AND SYSTEMS AND METHODS THEREOF

(75) Inventor: George Edward Williams, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/951,566

(22) Filed: Sep. 28, 2004

(65) Prior Publication Data

US 2006/0074605 A1    Apr. 6, 2006

(51) Int. Cl.
*G06F 7/04* (2006.01)

(52) U.S. Cl. .................. 702/189; 702/179; 702/182; 702/190

(58) Field of Classification Search ............ 702/79, 702/117, 118, 135, 138, 189, 182, 190; 370/230; 701/1, 14; 709/226; 713/189
See application file for complete search history.

(56) References Cited

U.S. PATENT DOCUMENTS

| 4,646,241 A | * | 2/1987 | Ratchford et al. ............ 701/14 |
| 4,669,097 A | | 5/1987 | Bristol ........................ 375/122 |
| 6,597,660 B1 | * | 7/2003 | Rueda et al. ............ 370/230.1 |
| 6,912,575 B1 | * | 6/2005 | Swift et al. ................. 709/226 |

* cited by examiner

Primary Examiner—Marc S. Hoff
Assistant Examiner—Felix Suarez
(74) Attorney, Agent, or Firm—Fletcher Yoder

(57) ABSTRACT

A system for compressing a set of data points is provided. The system includes a critical aperture compression module that is configured to discard one or more data points from the set of data points. The discarded one or more data points fall within a tolerance band surrounding a straight line that represents a trend of the discarded one or more data points. A remainder of the set of data points represents a compressed set of data points.

53 Claims, 8 Drawing Sheets

CRITICAL APERTURE CONVERGENCE FILTERING AND SYSTEMS AND METHODS THEREOF

BACKGROUND

The invention relates generally to data management systems and, more particularly, to a system and method for efficient data compression and data storage in a data management system.

In many industries, data management systems are important for efficient monitoring, sampling, storage, handing, processing, and analysis of data relating to certain equipment, processes, and so forth. For example, certain data management systems are useful for monitoring various processes at different times and locations by collecting operational data or parameters, which are useful for subsequent analysis of the monitored processes. In certain processes, the operational data or parameters include pressure, temperature, sound, velocity, fluid flow rate, or any other measurable physical, chemical, or biological parameters. The subsequent analysis may include a performance evaluation, an error analysis, a cost analysis, a failure prediction or life expectancy analysis, or another desired evaluation of the various processes.

In many of these analyses, the data management system is limited based on data sampling rates, data storage capacity, data compression efficiency, and other bottlenecks. The accuracy of these analyses often depends on the degree of data sampling, i.e., a higher level of data sampling results in greater accuracy of the analysis. Unfortunately, limitations of data storage capacity and compression efficiency often result in lower than desired rates of data sampling, thereby reducing the accuracy of the particular analysis. In process control applications, for example, data is collected from one or more parallel processes at very frequent intervals of time (e.g. one per second or one per minute), which leads to an immensely large amount of collected data. As a result, data compression is important for reducing the storage consumption of this collected data, while also maintaining the important portions of the collected data for use in the desired analysis.

Existing data compression techniques reduce the storage consumption of the collected data, yet these techniques sacrifice data accuracy for ease of storage. For example, one existing data compression technique involves combining and averaging a group of sequential data to create one average data point. However, by averaging, the data management system loses variations above and below the average data point, which may lead to inaccurate predictions based on the averaged data. Similarly, other existing data compression techniques may discard valid and significant data to save or open storage space for subsequent incoming data.

Therefore, there exists a need for an efficient data compression technique that provides for accurate data analysis and predictions.

BRIEF DESCRIPTION

In accordance with certain embodiments of the present technique, a system for compressing a set of data points is provided. The system includes a critical aperture compression module that is configured to discard one or more data points from the set of data points. The discarded one or more data points fall within a tolerance band surrounding a straight line that represents a trend of the discarded one or more data points. A remainder of the set of data points represents a compressed set of data points.

In accordance with certain other embodiments of the present technique, a method for achieving data compression is provided. The method involves providing a critical aperture having upper and lower slopes originating at an archived data point and extending to a held data point. The upper and lower slopes are obtained based on a tolerance band for the held data point and intermediate points between the archived data point and the held data point. The method also involves discarding the held data point if a slope of a line originating at the archived data point and extending to a subsequently new data point lies within the critical aperture.

In accordance with yet another aspect of the present technique, a system for compressing a set of data points sampled from an industrial unit is provided. The industrial unit is monitored via one or more sensors that provide the set of data points representing any measurable activity in the industrial unit. The system also includes a data management system configured to receive the set of data points from the one or more sensors and to discard one or more data points from the set of data points.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Disclosed herein are various embodiments of a system and method for providing reduced storage of information gathered by an exemplary data management system. These embodiments effectively reduce a set of data points representing one or more measurable operating parameters recorded from an exemplary industrial plant. For example, as discussed in further detail below, certain embodiments of the present technique define a critical aperture (e.g., upper and lower slopes) relative to a previous archived data point. A subsequent new data point is discarded if it is within this critical aperture, whereas a subsequent new data point is held if it is outside this critical aperture. In this manner, these embodiments provide an efficient and cost effective data compression technique that leads to reduced usage of storage space.

Figure 1:
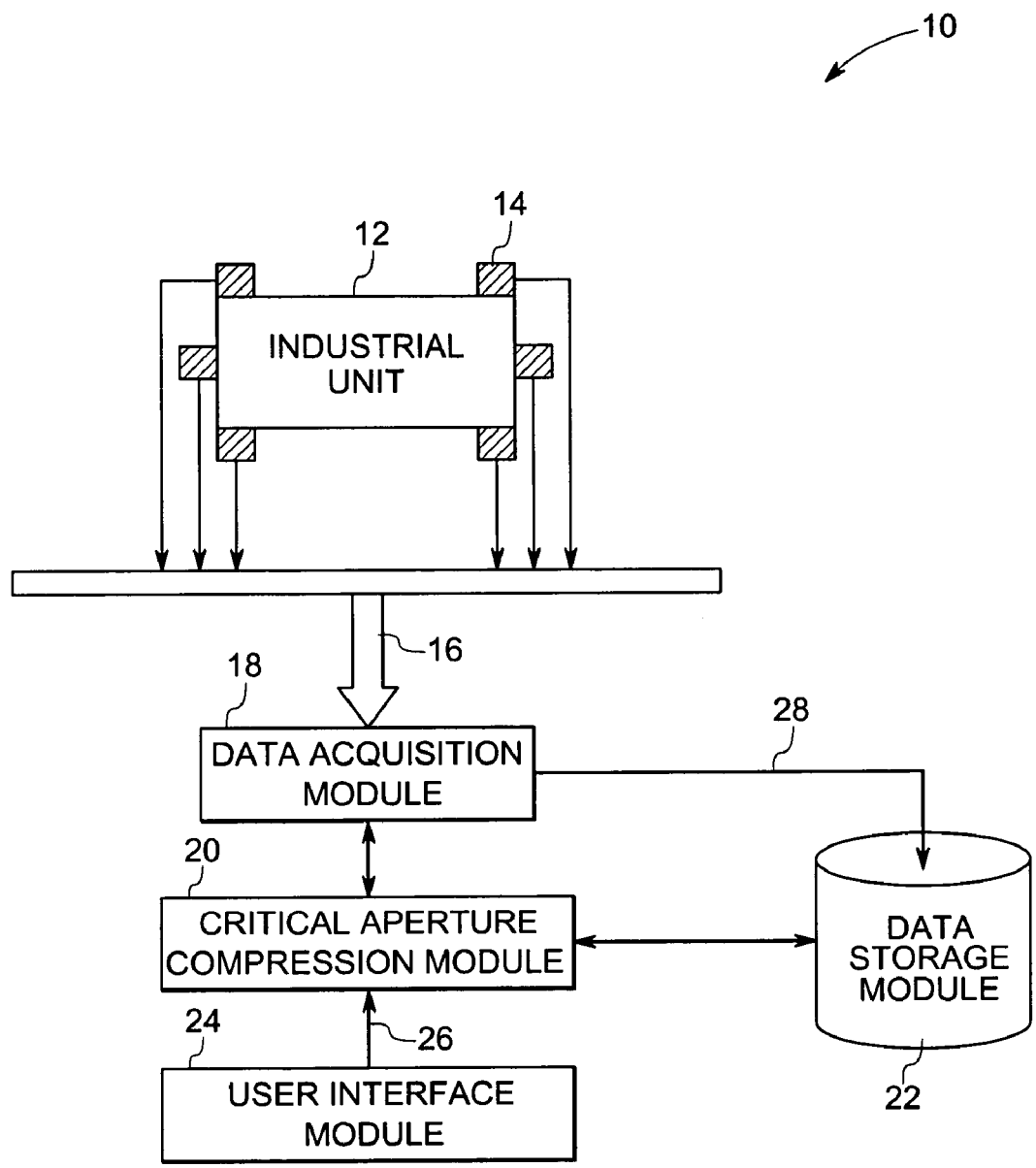
FIG. 1 is a diagram illustrating an exemplary system having a plurality of sensors and a critical aperture compression module in accordance with embodiments of the present technique.

Turning now to the drawings, and referring first to FIG. 1, an exemplary data management system 10 for compressing one or more data points from a set of data points is illustrated. The data management system 10 is used to collect data 16 from an industrial unit 12 via a plurality of sensors 14. The data management system 10 includes a data acquisition module 18 for obtaining the data 16 from the sensors 14, a critical aperture compression module 20 for filtering or compressing the data 16, a data storage module 22 for retaining the filtered or compressed data, and a user interface module 24 for interacting with and providing user input 26 into the system 10. In certain embodiments discussed below, the critical aperture compression module 20 facilitates reduced storage consumption of the data 16 by discarding data points that fall within a critical aperture (e.g., upper and lower slopes) relative to a previous archived data point. In other words, the critical aperture compression module 20 discards a series of data points within the critical aperture until a subsequent data point falls outside the critical aperture. At this outside data point, the critical aperture compression module 20 retains, stores, or generally holds the outside data point as the next archived data point, and the process repeats. Each of the aforementioned modules, including the critical aperture compression module 20, is discussed in greater detail in the sections that follow.

The industrial unit 12 includes a variety of devices that perform or facilitate an industrial task. Examples of industrial units 12 include fluid compression units; power generation equipment, such as, gas turbines, steam turbines, generators; gas turbine aircraft engines; heat transfer equipment, such as boilers, air pre-heaters, super heaters, or other heat exchanging devices; and heat generation equipment such as furnaces, plant operation monitoring such as paper mills; and/or production facilities such as automobile assembly plants. The sensors 14 are configured to monitor changes in operating parameters in the industrial unit 12.

The operating parameters may include temperature, pressure, volume, weight, mass, quantity, velocity (e.g., linear or rotational), acceleration, flow rate (e.g., fuel flow, air flow, etc.), position, tension, current, voltage, power, work output, time, color, hardness, viscosity, moisture/humidity, and so forth. Accordingly, the sensors 14 include a variety of sensing circuitry and mechanisms, such as, actuators, switches, gauges, meters, optical devices, temperature measuring devices (e.g., thermometer, thermocouple, thermistor, pyrometers, etc.), pressure measuring devices (e.g., barometers, manometers, etc.), scales, counters, timers, displacement measuring devices, speedometers, frequency measuring devices, flow meters, dynamometers, voltmeters, ammeters, ohmmeters, potentiometers, tachometers, colorimeter, spectrophotometers, strain gauges, viscometers, photometers, reflectometers, turbidimeters, hygrometers, calorimeters and so forth. In this exemplary embodiment, the sensors 14 facilitate monitoring, acquisition, sampling, analysis, and responsive control of the industrial unit 12. For example, if the sensors 14 identify undesirable states or changes in velocity, temperature, or other operating parameters, then the system 10 can respond by adjusting the appropriate operating parameters. In other exemplary embodiments, the sensors may not directly provide sensed data. Instead, the sensed data may be obtained from an archiving system or the data acquisition system that are configured to modify the sensed data by adjusting the signal gain, reducing noise, or convert the sensed data based on certain measurement standards. The modified sensed data may be processed in tandem or separately from the actual sensed data by critical aperture compression module.

In operation, the data management system 10 facilitates monitoring, acquisition, compression, storage, and analysis of data 16 from the plurality of sensors 14. For example, the data acquisition module 18 interacts with the sensors 14 to monitor and acquire (or sample) the data 16 corresponding to various operational parameters at a specified interval of time. Embodiments of data acquisition module 18 provide control of sampling rates, data types, engineering measurement units and so forth. In some embodiments, the system 10 transmits the data 16 to the data storage module 22 as a set or stream of data points 28.

In certain exemplary embodiments, the system 10 transmits the data 16 to the aperture compression module 20, which analyzes and compresses the data based on a data filtering algorithm as discussed in further detail below. In operation, the critical aperture compression module 20 uses this data filtering algorithm to reduce the set of data points 28, thereby reducing the storage consumption of the data points 28. The operating mechanism of the data filtering algorithm is described in greater detail below. In certain embodiments, the data acquisition module 18 may be configured to provide the set of data points 28 in substantially real-time to the critical aperture compression module 20, which performs data filtering or compression as the data is received from the data acquisition module 18. In this manner, the set of data points 28 are filtered or compressed as they are being stored on the data storage module 22. In other embodiments, the critical aperture compression module 20 may receive the set of data points 28 as previously recorded data. Under such a scenario, the data acquisition module 18 may provide the set of data points 28 to the data storage module 22, where the critical aperture compression module 20 can access the set of data points 28 for subsequent analysis and compression.

The data storage module 22 provides a reliable storage space for the sampled set of data points 28 and/or the compressed set of data points following the application of the data filtering algorithm in the critical aperture compression module 20. In certain embodiments, the data storage module 22 comprises a local storage device, a remote storage device, a network of computers or data storage devices, or other suitable storage configurations. Moreover, the data storage module 22 may include one or more magnetic media drives, hard disk drives, optical drives, or combinations thereof. In some embodiments, the data storage module 22 includes a Redundant Array of Independent (or Inexpensive) Disks (RAID), such as an array of redundant hard disk drives.

The user interface module 24 is used by a system operator for interacting with and providing the input 26 to the critical aperture compression module 20. The input 26 includes a variety of criteria that affect the amount of filtering or compression performed by the critical aperture compression module 20. For example, the input 26 may include tolerance bands or deviation limits, which the critical aperture compression module 20 uses to determine when a data point is held or discarded from the set of data points 28. In certain embodiments, the tolerance bands or deviation limits include upper and lower limits, such as an upper slope and a lower slope relative to the last archived point in the set of data points 28. As discussed in detail below, these upper and lower slopes define a critical aperture relative to the last archived point. The filtering algorithm of the critical aperture compression module 20 uses this critical aperture to determine when to retain or discard a subsequent point in the set of data points 28, as discussed below. The user interface may also be used to enable or disable data compression, set a minimum time interval, and set a maximum time interval before a timeout occurs.

Figure 2:
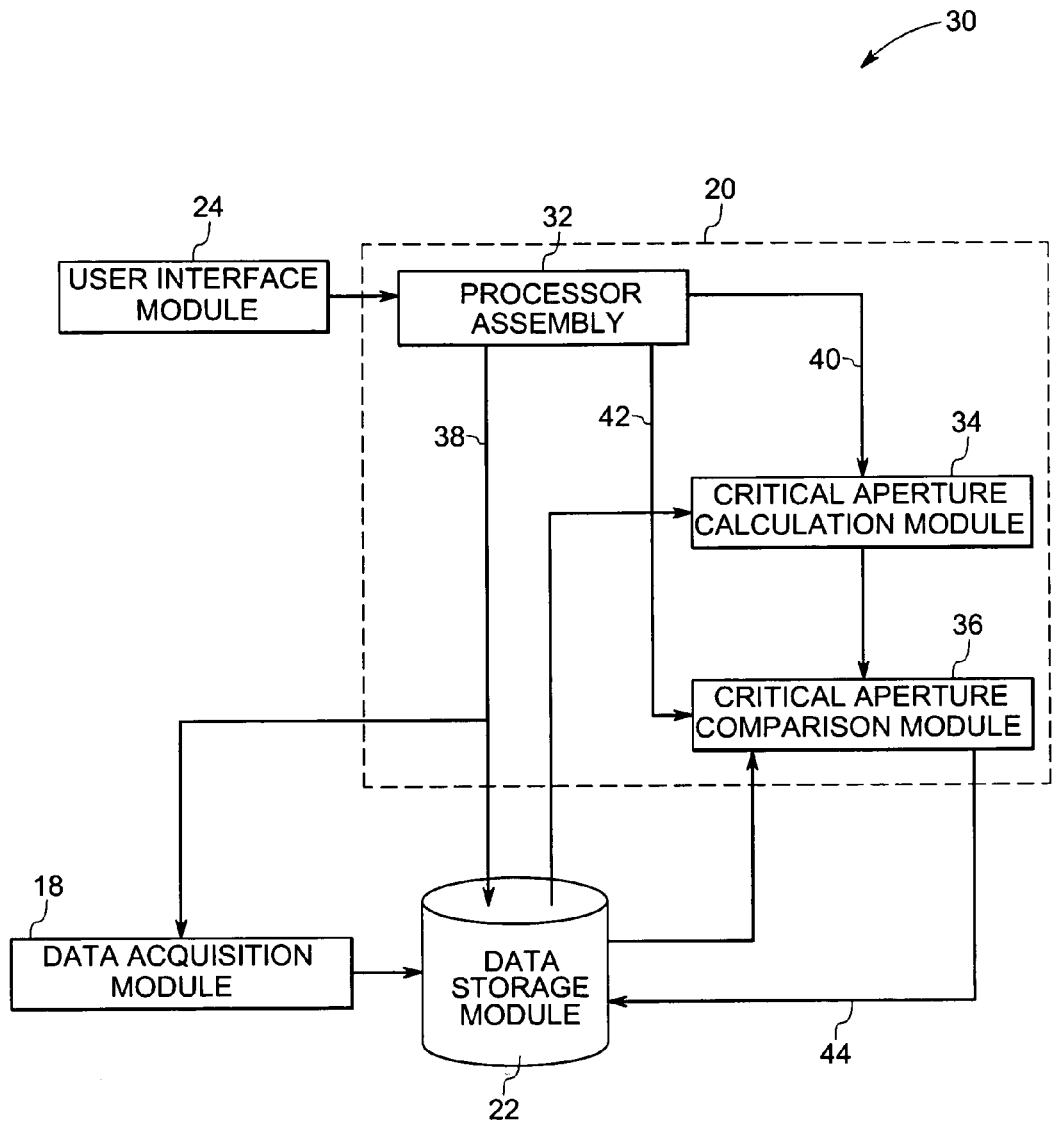
FIG. 2 is a diagram illustrating an exemplary embodiment of the critical aperture compression module illustrated in FIG. 1.

FIG. 2 is a diagram illustrating a system 30 having the critical aperture compression module 20 illustrated in FIG. 1 in accordance with certain embodiments of the present technique. In the illustrated system 30, the critical aperture compression module 20 includes a processor assembly 32, a critical aperture calculation module 34, and a critical aperture comparison module 36. In operation, the processor assembly 32 receives, processes, exchanges, and transmits data and control signals 38, 40, and 42 with the data storage module 22, the critical aperture calculation module 34, and the critical aperture comparison module 36, respectively. In addition, the processor assembly 32 executes a data filtering algorithm for compressing the set of data points 28, which the data acquisition module 18 obtains from the plurality of sensors 14 at the industrial unit 12 illustrated in FIG. 1. The processor assembly 32 is also configured to receive the user input 26 from a system operator (not shown) via the user interface module 24. Again, the user input 26 may include a variety of compression criteria, such as upper and lower tolerance bands or deviation limits to define a critical aperture, for the critical aperture compression module 20.

In operation of the critical aperture compression module 20, the series or set of data points 28 are evaluated one after the other in view of a critical aperture, e.g., upper and lower slopes, relative to a previous archived data point. The next point after the previous archived point is temporarily retained as a held point. If the next point after the held point is outside the critical aperture, then the critical aperture compression module 20 permanently retains the held point as the next archived point. Otherwise, if the next point after the held point is within the critical aperture, then the critical aperture compression module 20 discards the existing held point and temporarily retains this next point as the new held point. The module 20 will continue replacing the temporary held point with the next point until the next point falls outside the critical aperture. Upon reaching a next point that falls outside the critical aperture, the module 20 permanently retains the held point as the next archived point and, also, temporarily retains the next point as the new held point. As discussed in further detail below, this process repeats to filter out points within the set of data points 28, thereby reducing the storage consumption of the data points 28.

At each stage in the foregoing process, the critical aperture calculation module 34 calculates a critical aperture for the next data point based on an analysis of the previous archived data point, a presently held data point, and a permissible deviation for the next data point. In certain embodiments, the critical aperture compression module 20 provides permissible upper and lower deviations for each data point, and the critical aperture calculation module 34 defines an aperture for each data point as the upper and lower slopes extending from the previously archived data point to the upper and lower deviations about the respective data point. In other words, each data point between the archived data point and the next data point includes an aperture. In turn, the critical aperture calculation module 34 defines a critical aperture for the next data point as the intersection or common portion of all apertures between the archived data point and the next data point. As a result, the critical aperture generally shrinks as the critical aperture calculation module 34 analyzes subsequent new points. Critical aperture, as the term is used herein, may be defined as a set of slopes common to all previously computed apertures. The calculation of a critical aperture is discussed in further detail below with reference to FIG. 4.

Turning to the critical aperture comparison module 36, this module is configured to compare the critical aperture against the next data point. More specifically, embodiments of the critical aperture comparison module 36 calculate the slope between the archived data point and the next data point, and then compare this slope against the upper and lower slopes of the critical aperture. If the critical aperture comparison module 36 determines that this slope falls outside the upper and lower slopes of the critical aperture, then this is a triggering event that leads to the previous held point being archived and the next data point becoming the held point. Each archived data point is transmitted to the data storage module 22, which stores compressed data 44 according to this exemplary data filtering process.

Figure 3:
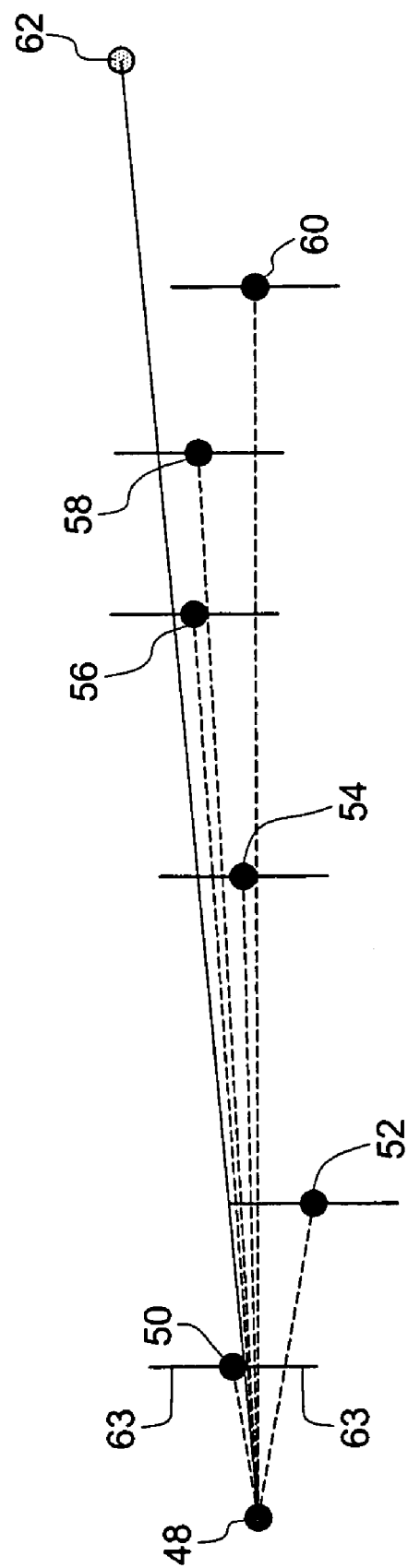
FIG. 3 is a graph illustrating an exemplary operation of the critical aperture compression module in evaluating a set of data points.

Consider as an example a graph (as illustrated in FIG. 3) illustrating a series of data points, generally represented by reference numerals 48 through 62. The critical aperture compression module 20 considers each data point for a possible compression in a sequential manner starting from the data point 48 which would typically be an archived data point. Any point whose tolerance band 63 intersects the line connecting point 48 with subsequent data points such as point 62 can be reconstructed by linear interpolation to within the specified limits. This is not the case for data point 60 whose reconstructed value would exceed the real value by more than the allowable error. Therefore, point 62 cannot be the end point for the archived line segment. Since data point 60 is the last point whose line connecting it to point 48 intersects all intervening tolerance bands, data point 60 is the data point that will define the end point for that segment and will be archived. In order to verify that each preceding tolerance band intersects every subsequent line connecting the archived data point (data point 48) to newly introduced data points, this data series would normally need to be saved until an end data point is identified, but the critical aperture technique described below allows the end data point to be found without having to save more than a single held data point. The present technique is highly effective for data compression because it evaluates each data point on its own merit rather than requiring a group of data points to be buffered and compared until a result is obtained.

Figure 4:
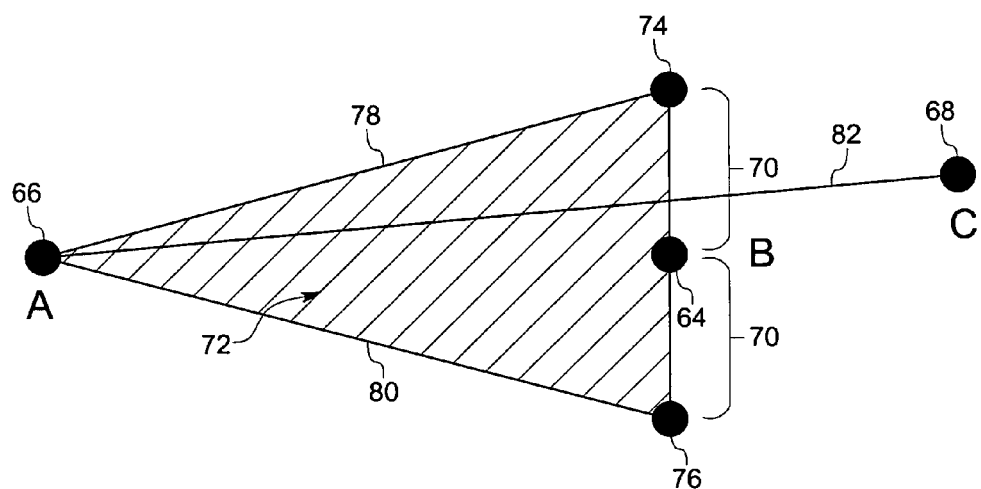
FIG. 4 is a graph illustrating an aperture for identifying when to hold a data point based on an archived data point, a subsequent new data point, and a permissible deviation in accordance with embodiments of the present technique.

In this context, FIG. 4 is a graph illustrating an aperture for identifying when to hold a data point B based on an archived data point A, a subsequent new data point C, and a permissible deviation in accordance with embodiments of the present technique. In the illustrated embodiment, the points B, A, and C are represented by a held data point 64 having coordinates $(x_1, y_1)$, an archived data point 66 having coordinates $(x_0, y_0)$, and a subsequent next data point 68 having coordinates $(x_2, y_2)$. The permissible deviation e is represented by a permissible deviation 70, which includes upper and lower tolerance bands or deviation limits as described in the previous section. As illustrated, an aperture 72 for the held point 64 includes the shaded area enclosed by a triangle formed by the archived data point 66, an upper end point 74 of the permissible deviation 70, and a lower end point 76 of the permissible deviation 70. Mathematically, the aperture 72 for the held data point 64 is bounded by the line segments 78 and 80, which have slopes calculated as follows:

$$\text{Slope of line segment } 78 = \frac{y1 + e - y0}{x1 - x0}$$

$$\text{Slope of line segment } 80 = \frac{y1 - e - y0}{x1 - x0}$$

For the data point 68 having coordinates ($x_2$, $y_2$), the slope of a line segment 82 joining the data point 68 with the archived data point 66 may be calculated as follows:

$$\text{Slope of line segment } 82 = \frac{y2 - y0}{x2 - x0}$$

In certain exemplary embodiments, where the calculated aperture 72 for held data point 64 is the only existing computed aperture, the aperture 72 becomes the critical aperture. Also, in the current embodiment, if the slope of the line segment 82 lies within the upper and lower slopes of the line segments 78 and 80 of the critical aperture 72, then the held data point 64 may be discarded and the data point 68 becomes the new held data point. A new aperture may now be calculated for the new held data point 68. Line 82 lies within the critical aperture if the slope of line segment 78 is greater than or equal to the slope of line segment 82 and if the slope of the line segment 82 is greater than or equal to the slope of the line segment 80. When line segment 82 does not lie within the critical aperture 72, the held data point 64 may be archived and becomes a new archived data point. The held data point 64 may also be archived when a user specified maximum timeout is exceeded with no point being archived during the duration of the maximum timeout.

Figure 5:
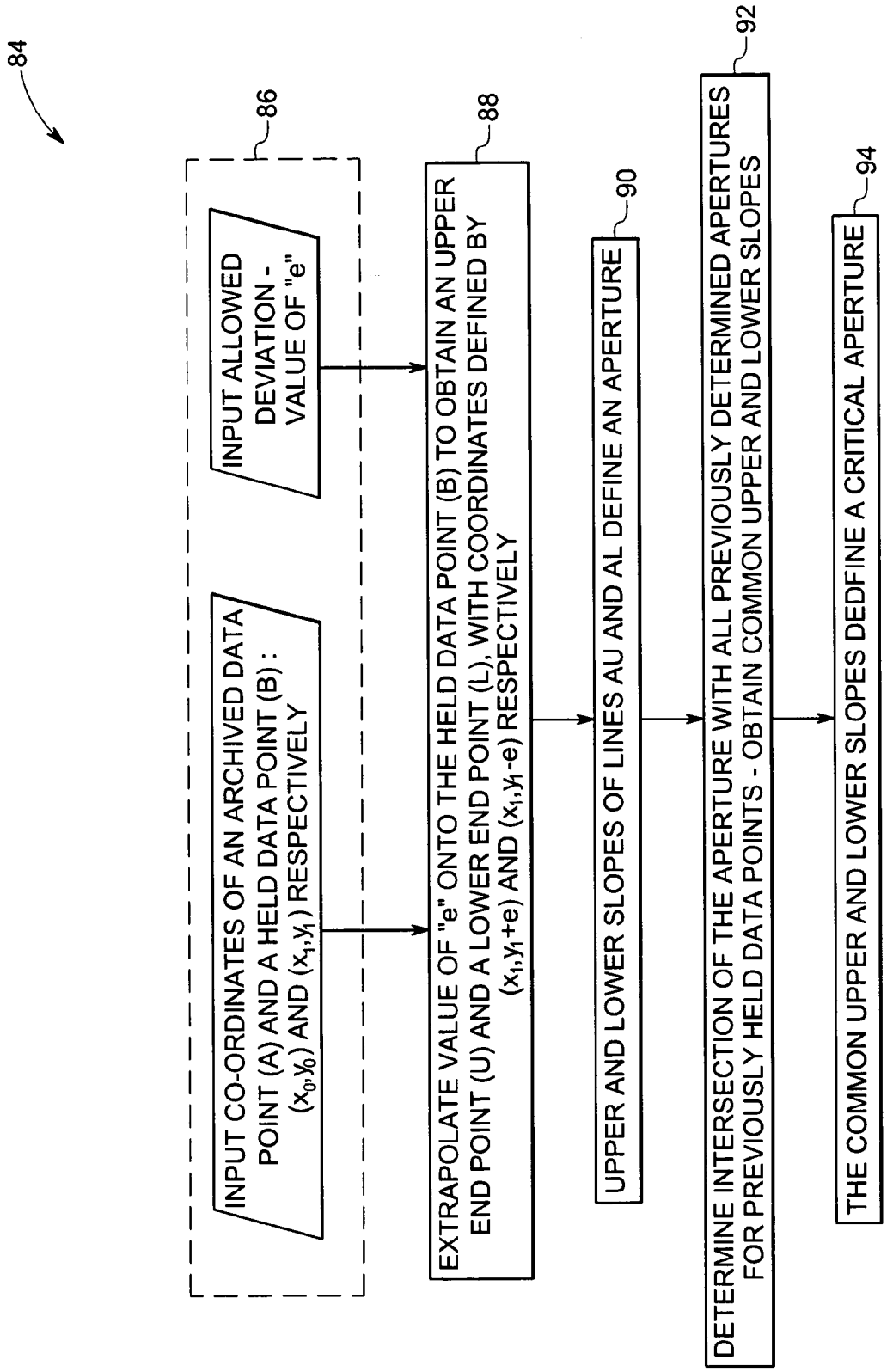
FIG. 5 is a flow chart illustrating a process for defining a critical aperture as illustrated in FIG. 4 in accordance with embodiments of the present technique.

FIG. 5 is a flow chart illustrating a process 84 for defining a critical aperture as illustrated in FIG. 4 in accordance with embodiments of the present technique. The process 84 involves providing as input, at step 86, the coordinates of the last archived data point (A), a held data point (B), and an allowed deviation (e). At step 88, based on the provided inputs, an upper end point (U) and a lower end point (L) are computed by extrapolating the allowed deviation (e) onto the coordinates of the held data point (B). At step 90, the slopes of the upper line AU and the lower line AL, denoted by line segments 78 and 80 in FIG. 4, are computed and these slopes define an aperture. At step 92, the process 84 determines the intersection of the aperture (e.g., the upper and lower slopes) with all previously calculated apertures for previously held data points. In other words, step 92 of the process 84 identifies the common portion of all apertures from the most recent archived data point (A) up to the present held data point (B). As a result, step 92 identifies a maximum upper slope and a minimum lower slope, which all apertures have in common. These will be the lower of the two upper slopes from the previous critical aperture and the current aperture and the higher of the two lower slopes from the previous critical aperture and the current aperture. The common upper and lower slopes determined at step 92 define the critical aperture as indicated in block 94.

Figure 6:
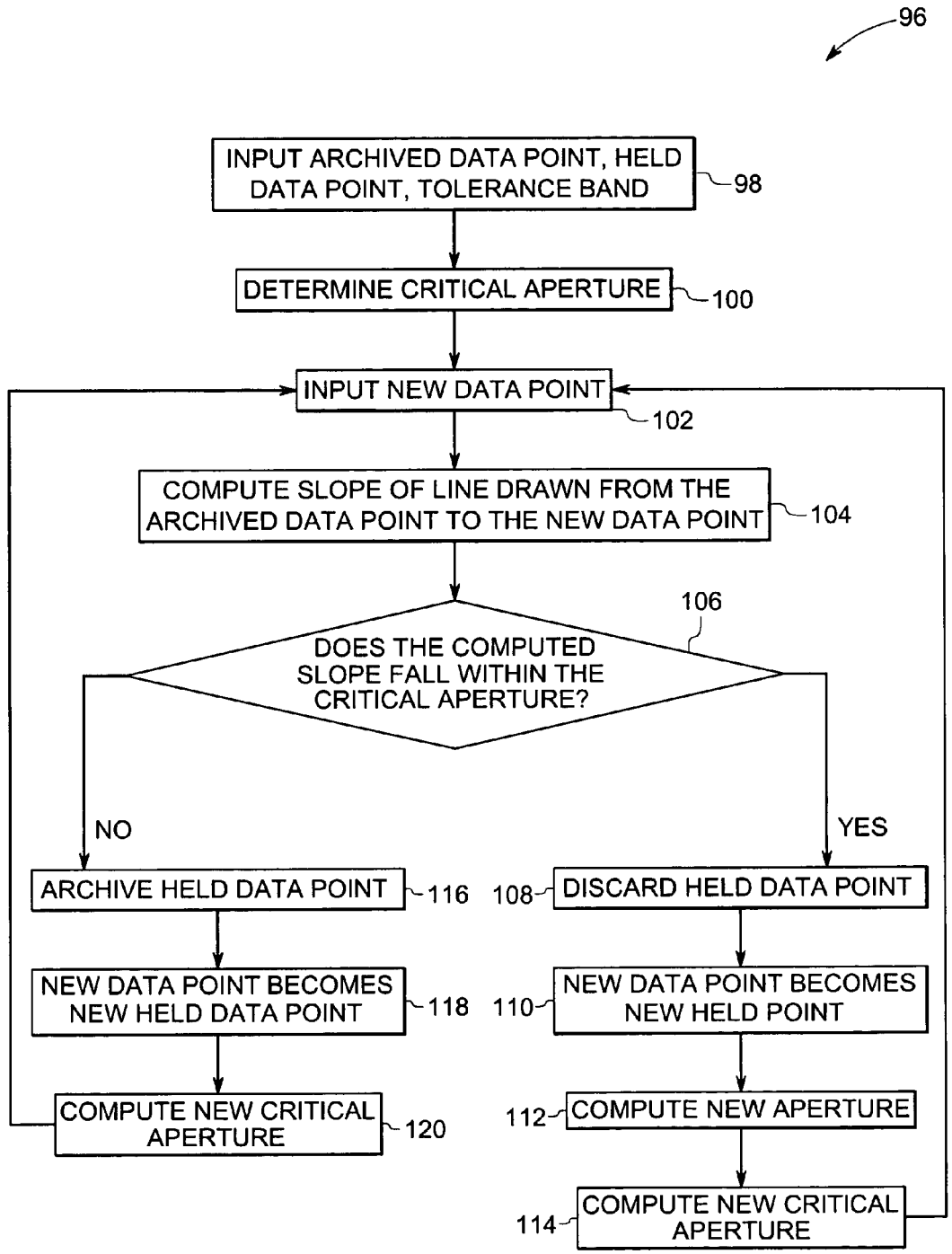
FIG. 6 is a flow chart illustrating a data filtering process of the critical aperture compression module 20 illustrated in FIG. 1 in accordance with embodiments of the present technique.

FIG. 6 is a flow chart illustrating a data filtering process 96 of the critical aperture compression module 20 illustrated in FIG. 1 in accordance with embodiments of the present technique. The data filtering process 96 is configured to compute a set of one or more critical apertures, and achieve data compression by discarding one or more data points from the set of data points 28 based on the respective critical apertures. It should be noted that despite discarding one or more data points, the data filtering algorithm also facilitates a reconstruction mechanism by which the discarded data points can be reconstructed by linear interpolation based on information stored about the archived data points.

As illustrated in FIG. 6, the process 96 involves receiving as input, at step 98, information about the last archived data point, the held data point, and the tolerance band. At step 100, the process 96 involves calculating the critical aperture by the exemplary techniques illustrated in FIGS. 4 and 5 and described in the earlier sections. Once the critical aperture is determined, information about a new data point is provided at step 102. At step 104, the slope from the last archived data point to the new data point is calculated. At step 106, the critical aperture computed at step 100 is compared with the slope for the new data point determined at step 104.

At query step 106, the process 96 compares the slope of the new data point (step 104) against the critical aperture (step 100). The comparison yields one of two mutually exclusive outcomes: (1) the slope of the new data point falls within the upper and lower slopes of the critical aperture, or (2) the slope of the new data point falls outside the upper and lower slopes of the critical aperture. Step 108 follows when the computed slope of the new data point falls within the slope of the critical aperture. At this point, the held data point is discarded. In step 110, the new data point becomes the new held point. At step 112, the process 96 computes a new aperture as discussed in detail above. The process 96 then computes a new critical aperture at step 114 as discussed in detail above. The sequence of steps 108 through 114 may be repeated further until all the data points are considered.

If the slope of the new data point does not fall within the critical aperture at query step 106, then the process 96 proceeds to step 116. This event may be defined as a disjoint aperture. At this step 116, the held data point is archived and becomes the new archived data point. The new data point becomes the new held data point at step 118 and a new critical aperture is computed at step 120. In a similar manner, the above-described sequence of steps 116 through 120 may be repeated further for a subsequent new data point until all the data points from the set of data points 28 have been considered. Thus, by repeating the method over a period of time and proceeding from one data point to another in the set of data points 28 sampled from the industrial unit 12 as illustrated in FIG. 1, a large number of data points may be discarded from the data storage module 22 (illustrated in FIG. 1). This results in a reduction in the storage space consumed by the set of data points 28.

Figure 7:
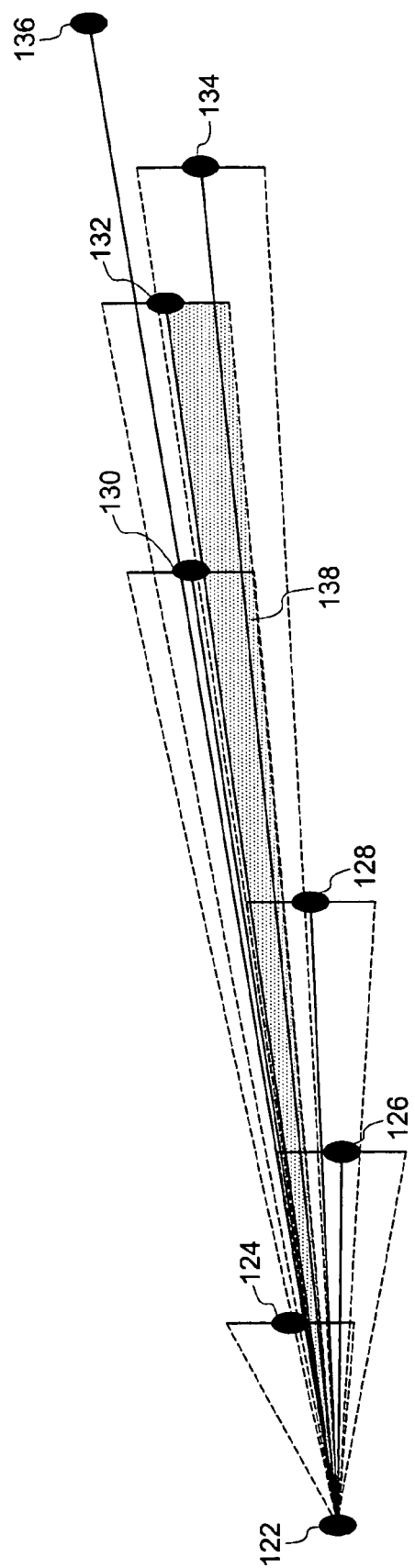
FIG. 7 is a graph illustrating an exemplary embodiment of the data filtering process illustrated in FIG. 6.

FIG. 7 is a graph illustrating an exemplary embodiment of the data filtering process illustrated in FIG. 6. In this exemplary embodiment, the data points 122 through 136 are considered for compression by the data filtering process 96. The data point 122 is the archived data point, and data points 124 through 132 are the intermediate data points discarded by the data filtering process 96 because the slopes of these data points were within the slope of the critical aperture 138. As explained previously, the intermediate data points 126 is discarded because a line joining the data point 126 to the archived data point 122 pass through the critical aperture 138 computed until the previous data point 124. Similarly, the intermediate data points 128 through 132 are discarded because lines joining each of the intermediate data points to the archived data point 122 pass through a critical aperture computed up until each of the respective intermediate data points. It should also be noted that the critical aperture 138 at a particular data point is completely enclosed by each of the computed apertures up to that particular data point. However, since the line joining the data point 136 to the archived data point 122 lies outside the critical aperture, the data point 134 becomes the new archived data point and point 136 becomes the new held point. It should be noted that a line joining the data point 134 to the archived data point 122 passes through the critical aperture 138 computed until data point 132. Further, it should also be noted that in the illustrated graph, the intermediate data points 122 through 132 are located in and around a straight line segment joining data point 134 to the archived data point 122 in a manner where the tolerance band of each of the discarded data points intersect the straight line segment. Therefore it can be construed that the straight line segment joining the archived data point 122 and the held data point 134 is a good representation of the trend of the discarded data points 124 through 132 and that the discarded data points can be reconstructed when desired by a linear interpolation of the coordinates of the straight line segment to within the specified error limit (e).

Figure 8:
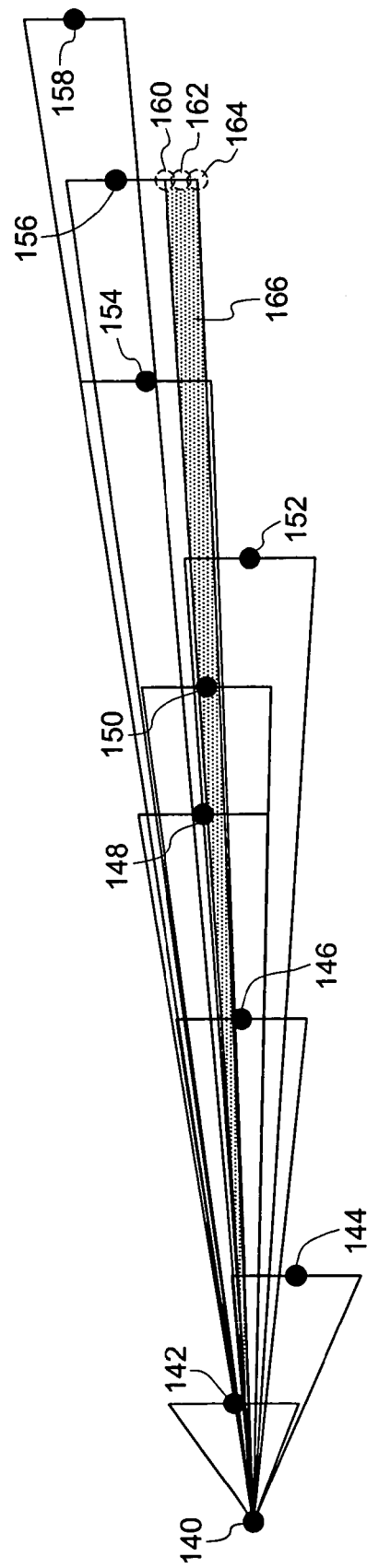
FIG. 8 is a graph illustrating another exemplary embodiment of the data filtering process illustrated in FIG. 6.

FIG. 8 is a graph illustrating another exemplary data filtering process in accordance with embodiments of the present technique. The set of data points 140 through 158 include an archived data point 140 and intermediate data points 142 through 150. In this exemplary embodiment, a set of one or more virtual data points generally represented by numerals 160, 162, and 164 are chosen such that the virtual data points lie within the tolerance band of an actual data point, which is represented by numeral 156 in this exemplary case. A held data point 152 is now selected based on the virtual data point instead of the actual data points. The critical aperture 166 is computed starting from the archived data point 140 and iteratively from data points 142 through 156. However, data point 158 is located outside the critical aperture since the lines joining the upper and lower end points for the data point 158 do not intersect the critical aperture 166. Therefore, the one or more virtual data points are chosen such that the virtual data points lie within the tolerance band of an actual data point, represented by numeral 156 in this exemplary case, and that which intersects the critical aperture 166. An advantage provided by this exemplary embodiment is that certain data points located close to each other may be discarded in order to be able to better consider data points that are located at a farther distance. This would also further enable a higher compression over a larger set of data points as simulations have indicated.

The various embodiments and aspects described in the earlier sections may include executable instructions (e.g., sequential or object-oriented code) for implementing various logical functions. The executable instructions can be embodied in any computer-readable medium for use by or in connection with a computer-based system that can retrieve the instructions and execute them. In the context of this application, the computer-readable medium can be any means that can contain, store, communicate, propagate, transmit or transport the instructions. The computer readable medium can be an electronic, a magnetic, an optical, an electromagnetic, or an infrared system, apparatus, or device. An illustrative, but non-exhaustive list of tangible media can include an electrical connection (electronic) having one or more wires, a portable computer diskette (magnetic), a random access memory (RAM) (magnetic), a read-only memory (ROM) (magnetic), an erasable programmable read-only memory (EPROM or flash memory) (magnetic), an optical fiber (optical), and a portable compact disc read-only memory (CDROM) (optical). Note that the tangible media may also include paper or another suitable medium upon which the instructions are printed by mechanical and electronic means or be hand-written. For instance, the instructions can be electronically captured via optical scanning of the paper or other medium, then compiled, interpreted or otherwise processed in a suitable manner if necessary, and then stored in a computer readable memory.

As will be appreciated by those skilled in the art, the above described data management system and techniques provide efficient data compression by discarding one or more data points from a set of data points while allowing an easy reconstruction of the discarded data points via linear interpolation using information from the stored data points. Reconstruction of the discarded data points, which may be used at any later period in time for any kind of data analysis or computation, allows the data management system to maintain an increased level of accuracy about the operating parameters of an industrial unit that the set of data points represent. The data management system also maintains the increased level of accuracy, over methods like averaging, in evaluating the set of data points via the data filtering algorithm by considering each data point from the set of data points and evaluating whether the particular data point should be discarded or not. The data management system thus permits the use of a reduced storage capacity for the data sets. In addition, the data management system allows for storing data points for longer periods of time for a given storage capacity resulting in an increase in cost savings. Furthermore, this type of data compression does not pack more data into fewer bits. It merely discards data it can reconstruct, leaving only endpoints of line segments that can be used in the linear interpolation point reconstruction method. Also, the data compression techniques may not always perform data compression. Exemplary scenarios where the data compression cannot be performed include scenarios when the data points cannot be defined by any trend or pattern.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A system, comprising:
a critical aperture compression module configured to discard one or more data points from a set of data points, wherein a tolerance band of the discarded one or more data points falls around a straight line representing a trend of the discarded one or more data points and wherein a remainder of the set of data points represents a compressed set of data points; wherein a slope of the straight line varies with each additional data point in a set of discarded one or more data points.

2. The system of claim 1, wherein the critical aperture compression module includes a processor assembly.

3. The system of claim 1, wherein the critical aperture compression module includes a critical aperture calculation module or a critical aperture comparison module, or a combination thereof.

4. The system of claim 1, wherein the tolerance band comprises upper and lower lines originating at upper and lower deviation limits about a first point in the set of data points and extending to upper and lower deviation limits about a second point in the set of data points, respectively.

5. The system of claim 1, further comprising one or more sensors configured to collect the set of data points.

6. The system of claim 5, wherein the one or more sensors are adapted to measure a temperature, a pressure, a time, a flow rate, a velocity, voltage, amperage, vibration, speed, acceleration, or combinations thereof or calculations based on the sensor measurements.

7. The system of claim 5, wherein the one or more sensors monitor at least one measurable process control parameter in an industrial system.

8. The system of claim 5, further comprising a data acquisition module configured to receive the set of data points from the one or more sensors and to provide the set of data points to the critical aperture compression module.

9. The system of claim 1, further comprising a data storage module configured to receive and store the set of data points from the critical aperture compression module.

10. The system of claim 1, further comprising a user interface module configured to provide one or more inputs from a system operator to the critical aperture compression module.

11. The system of claim 1, wherein the straight line represents the one or more discarded data points that fall within the tolerance band.

12. The system of claim 1, wherein the set of data points is provided to the critical aperture compression module in substantially real-time.

13. The system of claim 1, wherein the critical aperture compression module is configured to reconstruct the discarded one or more data points by a linear interpolation within the tolerance band.

14. A method for data compression, comprising:
providing a critical aperture having upper and lower slopes originating at an archived data point and extending to upper and lower deviation limits about a held data point based on a tolerance band for the held data point and intermediate points between the archived data point and the held data point; wherein providing the critical aperture comprises identifying an intersection of all apertures for data points between the archived data point and the subsequently new data point; and
discarding the held data point if a slope of a line originating at the archived data point and extending to a subsequently new data point lies within the critical aperture.

15. The method of claim 14, further comprising setting the new data point as a new held data point and computing a new critical aperture based on the new held data point.

16. The method of claim 14, wherein each of the apertures has upper and lower slopes originating at the archived data point and extending to upper and lower limits of the tolerance band for each respective point.

17. The method of claim 14, further comprising archiving the held data point if the slope is not within the critical aperture, wherein the held data point becomes a new archived data point.

18. The method of claim 14, further comprising setting a virtual data point as a new held data point and computing a new critical aperture based on the new held data point, wherein the virtual data point is different from an actual data point and wherein the virtual data point lies within the previously computed critical aperture and within the tolerance band of the actual data point.

19. The method of claim 14, further comprising obtaining one or more data points in substantially real time, the data points including the held data point and the subsequently new data point.

20. The method of claim 14, further comprising providing at least the tolerance band via a user interface module.

21. The method of claim 14, further comprising reconstructing the discarded held data point by a linear interpolation within the tolerance band.

22. A tangible media, comprising:
data filtering code, comprising:
code configured to provide a critical aperture having upper and lower slopes originating at an archived data point and extending to a held data point based on a tolerance band for the held data point and intermediate points between the archived data point and the held data point; wherein the upper and lower slopes are a function of the archived data point, the intermediate points, and the held data point; and
code configured to discard the held data point if a slope of a line originating at the archived data point and extending to a subsequent new data point lies within the critical aperture.

23. The tangible media of claim 22, further comprising code configured to set the new data point as a new held data point and computing a new critical aperture based on the new held data point.

24. The tangible media of claim 22, further comprising code configured to identify an intersection of all apertures for data points between the archived data point and the subsequently new data point, each of the apertures having upper and lower slopes originating at the archived data point and extending to upper and lower limits of the tolerance band for each respective point.

25. The tangible media of claim 22, further comprising code configured to archive the held data point if the slope is not within the critical aperture, wherein the held data point becomes a new archived data point.

26. The tangible media of claim 24, further comprising code configured to provide the one or more data points to the data filtering algorithm as previously recorded data points.

27. The tangible media of claim 24, further comprising code configured to determine the new critical aperture by the intersection of all critical apertures prior to a disjoint aperture.

28. The tangible media of claim 27, wherein the disjoint aperture has no slopes in common with the previous critical aperture.

29. The tangible media of claim 27, comprises code configured to receive user inputs for at least the tolerance band.

30. A method, comprising:
computing a critical aperture based on an archived data point, a held data point, or a tolerance band, or combinations thereof;
discarding the held data point if a computed slope of a line from the archived data point to a new data point falls within the computed critical aperture;
computing a slope of a line originating at the archived data point and extending to a virtual data point, wherein the tolerance band of the virtual data point lies within the critical aperture; and
computing a new critical aperture for a new held data point, wherein the new held data point is the new data point.

31. The method of claim 30, further comprising archiving the held data point if the slope does not fall within the computed critical aperture.

32. The method of claim 30, further comprising providing the archived data point, the held data point, or the tolerance band, or combinations thereof in substantially real-time.

33. The method of claim 30, further comprising providing the archived data point, the held data point, or the tolerance band, or combinations thereof as previously recorded data.

34. The method of claim 30, further comprising reconstructing the discarded held data point by a linear interpolation within the tolerance band.

35. A method, comprising:
supplying a set of data points sampled from an industrial system to a data management system, wherein the set of data points represent one or more measurable process parameters in the industrial system;
providing a tolerance band to the data management system; and
obtaining a compressed set of data points by discarding one or more data points from the set of data points, wherein the discarded one or more data points fall within the tolerance band surrounding a straight line representing a trend of the discarded one or more data points; wherein a characteristic of the straight line varies with each additional data point in a set of discarded one or more data points.

36. The method of claim 35, further comprising measuring the set of data points via one or more sensors disposed on the industrial unit.

37. The method of claim 35, further comprising delivering the set of data points from the industrial unit to the data management system in substantially real-time.

38. The method of claim 35, further comprising delivering the set of data points to the data management system as recorded data.

39. The method of claim 35, wherein the industrial unit includes a turbine unit, a generator unit, a thermal unit, a heat exchanger unit, a furnace, or a fluid compression unit, or combinations thereof.

40. A data management system, comprising:
means for providing a critical aperture having upper and lower slopes originating at an archived data point and extending to a held data point based on a tolerance band for the held data point and intermediate points between the archived data point and the held data point; wherein a characteristic of the critical aperture is a function of the archived data point, the intermediate points, and the held data point; and
means for discarding the held data point if a slope of a line originating at the archived data point and extending to a subsequent new data point lies within the critical aperture.

41. A system, comprising:
an industrial unit monitored via one or more sensors, wherein the sensors provide a set of data points that represent any measurable activity in the industrial unit; and
a data management system configured to receive theset of data points from the one or more sensors, wherein the data management system comprises a critical aperture compression module configured to discard one or more data points from the set of data points, wherein the discarded one or more data points fall within a tolerance band surrounding a straight line representing a trend of the discarded one or more data points and wherein a remainder of the set of data points represent a compressed set of data points; wherein a characteristic of the straight line varies with each additional data point in a set of discarded one or more data points.

42. The system of claim 41, wherein the industrial unit includes at least one of a turbine unit, a furnace unit, a heat exchanger unit, a fluid compression unit, or a generator unit or combinations thereof.

43. The system of claim 41, wherein the one or more sensors are adapted to measure from the industrial unit a temperature, a pressure, a time, a flow rate, a velocity, voltage, amperage, vibration, speed, acceleration, or combinations thereof.

44. The system of claim 41, wherein the critical aperture compression module includes a processor assembly, a critical aperture calculation module or a critical aperture comparison module.

45. The system of claim 41, wherein the data management system includes a data acquisition module configured to receive the set of data points via the one or more sensors and to provide the set of data points to the critical aperture compression module.

46. The system of claim 41, comprises a data storage module configured to receive and store the set of one or more data points from the critical aperture compression module.

47. The system of claim 41, wherein the critical aperture compression module receives the set of data points in substantially real-time or as previously recorded data.

48. The system of claim 41, wherein the critical aperture compression module configured to discard one or more data points from a set of data points, wherein the discarded one or more data points fall within a tolerance band surrounding a straight line representing a trend of the discarded one or more data points and wherein a remainder of the set of data points represent a compressed set of data points.

49. The system of claim 41, wherein the data management system includes a user interface module configured to provide one or more inputs from a system operator to the critical aperture compression module, the one or more inputs including at least one of a minimum permissible error, and a maximum permissible error, a minimum time before compressing, a maximum time after which archiving is forced, and a compression enable toggle.

50. A method of operation of a data management system in an industrial setup, comprising:
measuring a set of data points representing one or more process parameters from a device in the industrial setup;
computing via a data filtering algorithm, at least one of a critical aperture for a held data point and based on at least one of a tolerance band and an archived data point; wherein the critical aperture is determined by an intersection of all critical apertures prior to a disjoint aperture via the data filtering algorithm; and
discarding the held data point when a computed slope of a line drawn from the archived data point to a subsequent new data point falls within the critical aperture.

51. The method of claim 50, comprises archiving the held data point when the computed slope does not fall within the critical aperture.

52. The method of claim 50, comprises measuring the set of data points from the industrial setup in substantially real time via one or more sensors placed proximate to the industrial setup, wherein the industrial setup includes at least one of a turbine, a generator, an electrical motor, a compressor, and a heat exchanger.

53. The method of claim 50, wherein the disjoint aperture has no slope in common with previously computed critical apertures.

* * * * *